United States Patent
Ko et al.

(10) Patent No.: US 8,896,117 B2
(45) Date of Patent: Nov. 25, 2014

(54) SEMICONDUCTOR DEVICE BONDED BY AN ANISOTROPIC CONDUCTIVE FILM

(71) Applicants: Youn Jo Ko, Uiwang-si (KR); Jin Kyu Kim, Uiwang-si (KR); Dong Seon Uh, Uiwang-si (KR); Kil Yong Lee, Uiwang-si (KR); Jang Hyun Cho, Uiwang-si (KR)

(72) Inventors: Youn Jo Ko, Uiwang-si (KR); Jin Kyu Kim, Uiwang-si (KR); Dong Seon Uh, Uiwang-si (KR); Kil Yong Lee, Uiwang-si (KR); Jang Hyun Cho, Uiwang-si (KR)

(73) Assignee: Cheil Industries, Inc., Gumi-si, Kyeongsangbuk-do (KR)

(*) Notice: Subject to any disclaimer, the term of this patent is extended or adjusted under 35 U.S.C. 154(b) by 0 days.

(21) Appl. No.: 13/679,113

(22) Filed: Nov. 16, 2012

(65) Prior Publication Data

US 2013/0127038 A1    May 23, 2013

(30) Foreign Application Priority Data

Nov. 18, 2011 (KR) .................. 10-2011-0121106

(51) Int. Cl.
| H01L 23/52 | (2006.01) |
| C09J 9/02 | (2006.01) |
| C09J 133/04 | (2006.01) |
| C09J 7/00 | (2006.01) |
| H01L 23/00 | (2006.01) |

(52) U.S. Cl.
CPC . *H01L 23/52* (2013.01); *C09J 9/02* (2013.01); *H01L 24/83* (2013.01); *H01L 2224/29444* (2013.01); *H01L 24/32* (2013.01); *H01L 2224/29311* (2013.01); *C09J 2201/134* (2013.01); *C09J 2201/606* (2013.01); *H01L 2224/29447* (2013.01); *C09J 2203/326* (2013.01); *H01L 2224/29344* (2013.01); *C09J 2433/00* (2013.01); *H01L 2224/29393* (2013.01); *H01L 2224/29355* (2013.01); *H01L 24/29* (2013.01); *H01L 2224/29339* (2013.01); *H01L 2224/32225* (2013.01); *C09J 133/04* (2013.01); *H01L 2224/29411* (2013.01); *H01L 224/83851* (2013.01); *H01L 2224/29455* (2013.01); *H01L 2224/2929* (2013.01); *H01L 2224/2908* (2013.01); *C09J 2201/602* (2013.01); *H01L 2224/2939* (2013.01); *C09J 7/00* (2013.01); *H01L 2224/29439* (2013.01); *H01L 2224/29347* (2013.01)
USPC ........... 257/734; 257/783; 257/788; 257/751; 257/750; 252/512; 252/513; 252/514; 174/126.4; 174/126.2

(58) Field of Classification Search
USPC .......... 257/783, 734, 788, 751, 750; 252/512, 252/513, 514; 174/126.4, 247, 126.2
See application file for complete search history.

(56) References Cited

U.S. PATENT DOCUMENTS

| 6,444,305 | B2 * | 9/2002 | Banovetz et al. | 428/321.5 |
| 7,566,494 | B2 * | 7/2009 | Jun et al. | 428/323 |
| 7,803,449 | B2 * | 9/2010 | Inoue et al. | 428/141 |
| 7,879,259 | B2 * | 2/2011 | Kim et al. | 252/500 |
| 8,419,987 | B2 * | 4/2013 | Neumann | 264/176.1 |
| 8,608,985 | B2 * | 12/2013 | Ko et al. | 252/512 |
| 2011/0110066 | A1 | 5/2011 | Yamada et al. | |
| 2012/0168683 | A1 * | 7/2012 | Ko et al. | 252/500 |
| 2013/0127038 | A1 * | 5/2013 | Ko et al. | 257/734 |
| 2013/0154129 | A1 * | 6/2013 | Sul et al. | 257/788 |
| 2013/0213691 | A1 * | 8/2013 | Park et al. | 174/126.4 |
| 2014/0023882 | A1 * | 1/2014 | Brouwer et al. | 428/659 |
| 2014/0042374 | A1 * | 2/2014 | Ko et al. | 252/512 |

FOREIGN PATENT DOCUMENTS

| JP | 2007-257947 A | 10/2007 |
| JP | 2010-037539 A | 2/2010 |
| KR | 10-2010-0010694 A | 2/2010 |
| WO | 2012046923 A1 * | 4/2012 |
| WO | 2012091237 A1 * | 7/2012 |

* cited by examiner

*Primary Examiner* — Alexander Oscar Williams

(74) *Attorney, Agent, or Firm* — Lee & Morse, P.C.

(57) ABSTRACT

A semiconductor device bonded by an anisotropic conductive film, the anisotropic conductive film including a conductive adhesive layer and an insulating adhesive layer stacked thereon, an amount of reactive monomers in the conductive adhesive layer being higher than an amount of reactive monomers in the insulating adhesive layer.

10 Claims, No Drawings

SEMICONDUCTOR DEVICE BONDED BY AN ANISOTROPIC CONDUCTIVE FILM

CROSS-REFERENCE TO RELATED APPLICATION

This application claims priority to and the benefit of Korean Patent Application No. -2011-0121106 filed in the Korean Intellectual Property Office on Nov. 18, 2011, the entire contents of which are incorporated herein by reference.

BACKGROUND

1. Field

Embodiments relate to a semiconductor device bonded by an anisotropic conductive film.

2. Description of Related Art

Anisotropic conductive films (ACFs) refer to film-like adhesives in which conductive particles, e.g., metal particles including nickel or gold particles, or metal-coated polymer particles, are dispersed in a resin, e.g., an epoxy resin. Anisotropic conductive films may include polymer layers having electric anisotropy and an adhesive property, which exhibit conductive properties in a thickness direction thereof and insulating properties in a surface direction thereof, i.e., in a direction perpendicular to the thickness direction. When an anisotropic conductive film is disposed between connectable circuit boards and is subjected to heating and pressing under particular conditions, circuit terminals of the circuit boards may be electrically connected through the conductive particles, and an insulating adhesive resin may be filled in spaces between adjacent circuit terminals to isolate the conductive particles from each other, thereby providing high insulation performance between the circuit terminals.

SUMMARY

Embodiments are directed to a semiconductor device bonded by an anisotropic conductive film.

The embodiments may be realized by providing a semiconductor device bonded by an anisotropic conductive film, the anisotropic conductive film including a conductive adhesive layer and an insulating adhesive layer stacked thereon, an amount of reactive monomers in the conductive adhesive layer being higher than an amount of reactive monomers in the insulating adhesive layer.

The amount of the reactive monomers in the conductive adhesive layer may be about 25 to about 50 wt %, based on a total weight of the conductive adhesive layer, and the amount of the reactive monomers in the insulating adhesive layer may be about 20 to about 40 wt %, based on a total weight of the insulating adhesive layer.

The amount of the reactive monomers in the conductive adhesive layer may be greater than one to about two times the amount of the reactive monomers in the insulating adhesive layer.

The reactive monomers of at least one of the conductive adhesive layer and the insulating adhesive layer may include at least one selected from the group of 2-methacryloyloxyethyl phosphate, pentaerythritol tri(meth)acrylate, and 2-hydroxyethyl(meth)acrylate.

The embodiments may also be realized by providing a semiconductor device bonded by an anisotropic conductive film, the anisotropic conductive film including about 20 to about 45 wt % of a reactive monomer and about 55 to about 80 wt % of a binder resin, based on a total weight of the anisotropic conductive film, the anisotropic conductive film including at least two layers having different peel strength values.

The reactive monomer may include at least one selected from the group of 2-methacryloyloxyethyl phosphate, pentaerythritol tri(meth)acrylate, and 2-hydroxyethyl(meth)acrylate.

One of the layers is a conductive adhesive layer, another of the layers is an insulating adhesive layer, and the peel strength value of the conductive adhesive layer may be greater than the peel strength value of the insulating adhesive layer.

The peel strength value of the conductive adhesive layer may be about 3 to about 10 gf/mm at 25° C. and 1 MPa for 1 second, and the peel strength value of the insulating adhesive layer may be about 2 to about 7 gf/mm at 25° C. and 1 MPa for 1 second.

The embodiments may also be realized by providing a semiconductor device bonded by an anisotropic conductive film, the anisotropic conductive film including about 45 to about 75 wt % of a thermoplastic resin, about 1 to about 10 wt % of conductive particles, and about 20 to about 45 wt % of a reactive monomer, based on a total weight of the anisotropic conductive film, the anisotropic conductive film having an elongation of 400 to 800%.

The reactive monomer may include at least one selected from the group of 2-methacryloyloxyethyl phosphate, pentaerythritol tri(meth)acrylate, and 2-hydroxyethyl(meth)acrylate.

DETAILED DESCRIPTION

It will be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present.

Exemplary embodiments will now be described in detail. Herein, the indefinite article "a", "an" and derivation thereof may not exclude a plurality.

According to an embodiment, there is provided a semiconductor device bonded by an anisotropic conductive film. The anisotropic conductive film may include a conductive adhesive layer and an insulating adhesive layer stacked thereon. An amount of reactive monomers in the conductive adhesive layer may be higher than an amount of reactive monomers in the insulating adhesive layer.

The anisotropic conductive film may exhibit excellent adhesion between the conductive adhesive layer and glass, and may have excellent release force between the insulating adhesive layer and a release film in pre-bonding, thereby helping to prevent process defects.

The reactive monomers in the conductive adhesive layer may be present in an amount of about 25 to about 50% by weight (wt %), e.g., about 30 to about 45 wt %, based on a total weight of the conductive adhesive layer.

The reactive monomers in the insulating adhesive layer may be present in an amount of about 20 to about 40 wt %, e.g., about 25 to about 35 wt %, based on a total weight of the insulating adhesive layer.

In an implementation, the amount of the reactive monomer in the conductive adhesive layer may be greater than one to about two times the amount of the reactive monomers in the insulating adhesive layer, e.g., greater than 1 to about 1.8 times, or about 1.1 to about 1.5 times. For example, the conductive adhesive layer may include up to about two times the amount of reactive monomer that is included in the insulating adhesive layer.

Another embodiment provides a semiconductor device bonded by an anisotropic conductive film. The anisotropic conductive film may include about 20 to about 45 wt % of reactive monomers and about 55 to 80 about wt % of binder resins, e.g., about 25 to about 40 wt % of reactive monomers and about 60 to about 75 wt % of binder resins, based on a total weight of the anisotropic conductive film. The anisotropic conductive film may include at least two layers having different peel strength values. The at least two layers may include an upper layer (e.g., a conductive adhesive layer) and a lower layer (e.g., an insulating adhesive layer).

The upper layer may have a peel strength value of about 3 to about 10 gf/mm at 25° C. and 1 MPa for 1 second, and the lower layer may have a peel strength value of about 2 to about 7 gf/mm under the same conditions. In an implementation, the upper layer, e.g., the conductive adhesive layer, may have a higher peel strength value than that of the lower layer, e.g., the insulating adhesive layer.

Another embodiment provides a semiconductor device bonded by an anisotropic conductive film. The anisotropic conductive film may include about 45 to about 75 wt % of a thermoplastic resin, about 1 to about 10 wt % of conductive particles, and about 20 to about 45 wt % of a reactive monomer, e.g., about 60 to about 70 wt % of a thermoplastic resin, about 1 to about 10 wt % of conductive particles, and about 25 to about 40 wt % of a reactive monomer, based on a total weight of the anisotropic conductive film. The anisotropic conductive film may have an elongation of about 400 to about 800%.

The reactive monomer of the conductive adhesive layer and/or the insulating adhesive layer may include, e.g., a (meth)acrylate monomer. In an implementation, the reactive monomer may include at least one selected from the group of acrylates having a phosphate group, acrylates having a hydroxyl group, acrylates having an epoxy group, tri(meth)acrylates, and isocyanurates. In an implementation, the reactive monomer may include at least one selected from the group of 2-methacryloyloxyethyl phosphate, pentaerythritol tri(meth)acrylate, and 2-hydroxyethyl(meth)acrylate.

In an implementation, the semiconductor device may include a wiring substrate; an anisotropic conductive film attached to a chip-mounted side of the wiring substrate; and a semiconductor chip mounted on the film.

The wiring substrate and the semiconductor chip are not particularly limited and may include a wiring substrate and any suitable semiconductor chip.

A method of manufacturing the semiconductor device may include any suitable process.

In the anisotropic conductive film according to an embodiment, the conductive adhesive layer may include, e.g., a binder resin, reactive monomers, a radical initiator, and conductive particles, and the insulating adhesive layer may include, e.g., a binder resin, reactive monomers, and a radical initiator. Hereinafter, each component will be described in detail.

(a) Binder Resin

The binder resin may include, e.g., a thermoplastic resin, an acrylic resin, a polyurethane resin, a polyurethane acrylate resin, a polyester urethane resin, and/or a nitrile butadiene rubber (NBR) resin.

Thermoplastic Resin

The thermoplastic resin may include at least one selected from the group of acrylonitrile, phenoxy, butadiene, acrylic, polyurethane, urethane acrylate, polyamide, olefin, silicone, and/or NBR resins, without being limited thereto. The thermoplastic resin may have a weight average molecular weight of about 1,000 to about 1,000,000 g/mol. Within this range, proper film strength may be obtained, phase separation may be reduced and/or prevented, and deterioration of adhesive strength due to reduced adhesion to an adherend may be reduced and/or prevented.

In the conductive adhesive layer, the thermoplastic resin may be present in an amount of about 50 to about 80 wt %, e.g., about 60 to about 75 wt %, based on the total weight of the conductive adhesive layer. In the insulating adhesive layer, the thermoplastic resin may be present in an amount of about 50 to about 90 wt %, e.g., about 65 to about 85 wt %, based on the total weight of the insulating adhesive layer.

Acrylic Resin

The acrylic resin may be obtained by polymerization of an acrylic monomer and/or a monomer polymerizable with the acrylic monomer. For example, the acrylic resin may be produced by polymerization of at least one monomer selected from the group of (meth)acrylates having C2 to C10 alkyl groups, (meth)acrylic acid, vinyl acetates, and modified acrylic monomers thereof. A polymerization process is not particularly limited.

The acrylic resin may be included in the binder resin in an amount of 0 to about 40 wt %, based on a total weight of the film.

Polyurethane Resin

The polyurethane resin may include a polymer resin having a urethane bond.

The polymer resin having a urethane bond may be obtained by polymerization of, e.g., isophorone diisocyanate, polytetramethylene glycol, or the like. The polyurethane resin may have a weight average molecular weight of about 50,000 to about 100,000 g/mol.

The polyurethane resin may be included in the binder resin in an amount of 0 to about 40 wt %, based on the total weight of the film.

Polyurethane Acrylate Resin

The polyurethane acrylate resin may be obtained by copolymerization of, e.g., isocyanate, polyol, diol, and hydroxyacrylate.

The isocyanate may include at least one selected from the group of aromatic, aliphatic, and alicyclic diisocyanates. For example, the isocyanate may include at least one selected from the group of tetramethylene-1,4-diisocyanate, hexamethylene-1,6-diisocyanate, cyclohexylene-1,4-diisocyanate, methylene bis(4-cyclohexyl isocyanate), isophorone diisocyanate, and/or 4,4-methylene bis(cyclohexyl diisocyanate).

The polyol may include at least one selected from the group of polyester polyols, polyether polyols, and polycarbonate polyols. The polyol may be obtained by condensation of a dicarboxylic acid compound and a diol compound. Examples of the dicarboxylic acid compound may include succinic acid, glutaric acid, isophthalic acid, adipic acid, suberic acid, azelaic acid, sebacic acid, dodecanedicarboxylic acid, hexahydrophthalic acid, terephthalic acid, ortho-phthalic acid, tetrachlorophthalic acid, 1,5-naphthalenedicarboxylic acid, fumaric acid, maleic acid, itaconic acid, citraconic acid, mesaconic acid, and tetrahydrophthalic acid. Examples of the diol compound may include ethylene glycol, propylene glycol, 1,3-propanediol, 1,3-butanediol, 1,4-butanediol, 1,5-pentanediol, 1,6-hexanediol, neopentyl glycol, diethylene glycol, dipropylene glycol, triethylene glycol, dibutylene glycol, 2-methyl-1,3-pentanediol, 2,2,4-trimethyl-1,3-pentanediol, and 1,4-cyclohexanedimethanol. In an implementation, a proper polyether polyol may include, e.g., polyethylene glycol, polypropylene glycol, and/or polytetraethylene glycol.

The diol may include at least one selected from the group of 1,3-propanediol, 1,3-butanediol, 1,4-butanediol, 1,5-pentanediol, 1,6-hexanediol, neopentyl glycol, diethylene glycol, dipropylene glycol, triethylene glycol, tetraethylene glycol, dibutylene glycol, 2-methyl-1,3-pentanediol, 2,2,4-trimethyl-1,3-pentanediol, and 1,4-cyclohexanedimethanol.

A polymerization method of manufacturing the polyurethane acrylate resin is not particularly limited. The polyurethane acrylate resin may be included in the binder resin in an amount of 0 to about 30 wt %, based on the total weight of the film.

Polyester Urethane Resin

The polyester urethane resin may be obtained by reaction of a polyester polyol and a diisocyanate.

The polyester polyol may refer to a polymer having plurality of ester groups and plurality of hydroxyl groups. The polyester polyol may be obtained by reaction of a dicarboxylic acid and a diol.

Examples of the dicarboxylic acid may include terephthalic acid, isophthalic acid, adipic acid, and sebacic acid. In an implementation, the dicarboxylic acid may include aromatic or aliphatic dicarboxylic acids.

Examples of the diol may include ethylene glycol, propylene glycol, 1,4-butanediol, hexanediol, neopentyl glycol, diethylene glycol, and triethylene glycol.

Examples of the diisocyanate may include 2,4-tolylene diisocyanate (TDI), 4,4'-diphenylmethane diisocyanate (MDI), 1,6-hexamethylene diisocyanate (HDI), and isophorone diisocyanate (IPDI). In an implementation, the diisocyanate may include aromatic, alicyclic, or aliphatic diisocyanates.

NBR Resin

The NBR resin may be a copolymer obtained by emulsion polymerization of acrylonitrile and butadiene. Amounts of the acrylonitrile and the butadiene in the copolymer may not be limited, and any suitable polymerization method may be used. The NBR resin may have a weight average molecular weight of about 50,000 to about 2,000,000 g/mol.

The NBR resin may be included in the binder resin in an amount of 0 to about 15 wt %, based on the total weight of the film.

(b) Reactive Monomer

According to an embodiment, the reactive monomer may refer to a compound having a molecular weight of less than about 1,000 and that actually causes or participates in a curing reaction. For example, the reactive monomer may include a (meth)acrylate monomer.

The reactive monomer may be present in the conductive adhesive layer in an amount of about 25 to about 50 wt %, based on the total weight of the conductive adhesive layer. Within this range, the conductive adhesive layer may exhibit an increase in adhesion, thereby preventing process defects in pre-bonding. Also, fluidity of the adhesive layer may be suitably controlled to help avoid short circuit caused by flowing of the conductive particles. In an implementation, the reactive monomer may be present in an amount of about 30 to about 45 wt %.

The reactive monomer may be present in the insulating adhesive layer in an amount of about 20 to about 40 wt %, based on the total weight of the insulating adhesive layer. In an implementation, the reactive monomer may be present in an amount of about 25 to about 35 wt %.

The reactive monomer may be present in the conductive adhesive layer in a larger amount than in the insulating adhesive layer. For example, the amount of the reactive monomer in the conductive adhesive layer may be greater than one to about two times the amount of the reactive monomers of the insulating adhesive layer. Within this range, the conductive adhesive layer may exhibit a higher adhesion than the insulating adhesive layer in pre-bonding, thereby facilitating removal of the release film. Further, the fluidity of the conductive particles of the conductive adhesive layer may be controlled to thereby help prevent a short circuit.

In an implementation, the amount of the reactive monomer in the conductive adhesive layer may be, e.g., greater than 1 to about 1.8 times the amount of the reactive monomers of the insulating adhesive layer, or about 1.1 to about 1.5 times.

(Meth)acrylate Monomer

The (meth)acrylate monomer may include, e.g., at least one selected from the group of 6-hexanediol mono(meth)acrylate, 2-hydroxyethyl(meth)acrylate, 2-hydroxypropyl (meth)acrylate, 2-hydroxybutyl(meth)acrylate, 2-hydroxy-3-phenyloxypropyl(meth)acrylate, 1,4-butanediol(meth)acrylate, 2-hydroxyalkyl(meth)acryloyl phosphate, 4-hydroxycyclohexyl(meth)acrylate, neopentyl glycol mono (meth)acrylate, trimethylolethane di(meth)acrylate, trimethylolpropane di(meth)acrylate, pentaerythritol tri(meth) acrylate, dipentaerythritol penta(meth)acrylate, pentaerythritol hexa(meth)acrylate, dipentaerythritol hexa (meth)acrylate, glycerin di(meth)acrylate, t-hydrofurfuryl (meth)acrylate, isodecyl(meth)acrylate, 2-(2-ethoxyethoxy) ethyl(meth)acrylate, stearyl(meth)acrylate, lauryl(meth) acrylate, 2-phenoxyethyl(meth)acrylate, isobornyl(meth) acrylate, tridecyl(meth)acrylate, ethoxylated nonylphenol (meth)acrylate, ethylene glycol di(meth)acrylate, diethylene glycol di(meth)acrylate, triethylene glycol di(meth)acrylate, t-ethylene glycol di(meth)acrylate, polyethylene glycol di(meth)acrylate, 1,3-butylene glycol di(meth)acrylate, tripropylene glycol di(meth)acrylate, ethoxylated bisphenol-A di(meth)acrylate, cyclohexanedimethanol di(meth) acrylate, phenoxy-t-glycol(meth)acrylate, 2-methacryloyloxyethyl phosphate, dimethyloltricyclodecane di(meth) acrylate, trimethylolpropane benzoate acrylate, acid phosphoxyethyl(meth)acrylate, 2-acryloyloxyethyl phthalate, trimethylolpropane acrylate, tetramethylolmethane tetraacrylate, 2-hydroxy-1,3-diacryloxypropane, 2,2-bis[4-(arcyloxypolymethoxy)phenyl]propane, 2,2-bis[4-(arcyloxypolyethoxy)phenyl]propane, dicyclopentenyl acrylate, tricyclodecanyl acrylate, tris(acryloyloxyethyl)isocyanorate, isocyanuric acid ethylene oxide-modified diacrylate, urethane acrylate, and combinations thereof.

The reactive monomer may include a (meth)acrylate monomer. In an implementation, the reactive monomer may include at least one selected from the group of an acrylate having a phosphate group, an acrylate having a hydroxyl group, an acrylate having an epoxy group, a tri(meth)acrylate, and an isocyanurate. In an implementation, the reactive monomer may include at least one selected from the group of 2-methacryloyloxyethyl phosphate, pentaerythritol tri(meth) acrylate and 2-hydroxyethyl(meth)acrylate.

In an implementation, the reactive monomer of the conductive adhesive layer may include, e.g., 2-methacryloyloxyethyl phosphate. For example, the 2-methacryloyloxyethyl phosphate may be included in the conductive adhesive layer in an amount of greater than 0 to about 5 wt % based on the total weight of the conductive adhesive layer.

In an implementation, the reactive monomer of the conductive adhesive layer may include, e.g., pentaerythritol tri (meth)acrylate. For example, the pentaerythritol tri(meth) acrylate may be included in the conductive adhesive layer in an amount of greater than 0 to about 20 wt %, based on the total weight of the conductive adhesive layer.

In an implementation, the reactive monomer of the conductive adhesive layer may include, e.g., 2-hydroxyethyl (meth)acrylate. For example, the 2-hydroxyethyl(meth)acrylate may be included in the conductive adhesive layer in an amount of greater than 0 to about 20 wt %, based on the total weight of the conductive adhesive layer.

In an implementation, the reactive monomer of the insulating adhesive layer may include, e.g., 2-methacryloyloxyethyl phosphate. For example, the 2-methacryloyloxyethyl phosphate may be included in the insulating adhesive layer in an amount of greater than 0 to about 5 wt %, based on the total weight of the insulating adhesive layer.

In an implementation, the reactive monomer of the insulating adhesive layer may include, e.g., pentaerythritol tri(meth)acrylate. For example, the pentaerythritol tri(meth)acrylate may be included in the insulating adhesive layer in an amount of greater than 0 to about 15 wt %, based on the total weight of the insulating adhesive layer.

In an implementation, the reactive monomer of the insulating adhesive layer may include, e.g., 2-hydroxyethyl (meth)acrylate. For example, the 2-hydroxyethyl(meth)acrylate may be included in the insulating adhesive layer in an amount of greater than 0 to about 15 wt %, based on the total weight of the insulating adhesive layer.

(c) Radical Initiator

The radical initiator may include at least one of a photocurable initiator and a heat curable initiator. In an implementation, a heat curable initiator may be used.

The radical initiator may be included in an amount of about 0.5 to about 10 wt %, based on the total weight of the film.

Photocurable Initiator

Examples the photocurable initiator may include benzophenone, methyl o-benzoylbenzoate, 4-benzoyl-4-methyl-diphenyl sulfide, isopropylthioxanthone, diethylthioxanthone, ethyl 4-diethylbenzoate, benzoin ether, benzoylpropyl ether, 2-hydroxy-2-methyl-1-phenylpropan-1-one, and diethoxyacetophenone.

Heat Curable Initiator

The heat curable initiator may include, e.g., a peroxide initiator and/or an azo initiator.

Examples of the peroxide initiator may include benzoyl peroxide, lauryl peroxide, t-butyl peroxylaurate, 1,1,3,3-tetramethylbutylperoxy-2-ethylhexanoate, and cumene hydroperoxide.

Examples of the azo initiator may include 2,2'-azobis(4-methoxy-2,4-dimethylvaleronitrile), dimethyl-2,2'-azobis(2-methylpropionate), and 2,2'-azobis(N-cyclohexyl-2-methylpropionate).

(d) Conductive Particles

The conductive particles of the conductive adhesive layer may include metal particles, e.g., gold, silver, nickel, copper, tin, or solder particles; carbon particles; metal-coated resin particles, e.g., particles of benzoguanine, polymethylmethacrylate (PMMA), an acrylic copolymer, polystyrene, or modified resins thereof coated with gold, silver, nickel, copper, tin, or solder; and insulation-treated conductive particles that are further coated with insulating particles or an insulating film thereon.

An amount of the conductive particles may be varied, depending on a purpose of the anisotropic conductive film. In an implementation, the conductive particles may be included in an amount of about 0.5 to about 20 wt %, based on the total weight of the conductive adhesive layer. Within this range, suitable conductivity may be achieved and a short circuit may be prevented. In an implementation, the conductive particles may be included in an amount of about 1 to about 10 wt %.

In an implementation, the conductive particles may have a particle size of, e.g., about 0.1 µm to about 10 µm (mean diameter). Within this range, satisfactory adhesive strength and connection reliability may be achieved. In an implementation, the size of the conductive particles may be about 1 µm to about 5 µm.

(e) Thickness of Adhesive Layer

The conductive adhesive layer may have a suitable thickness that is determined or selected based on the particle size of the conductive particles. For example, if the conductive particles have a particle size of about 3 µm, the thickness of the conductive adhesive layer may be about 4 µm to about 6 µm.

The insulating adhesive layer may have a suitable thickness that is determined or selected based on a size of spaces between electrodes or an interval between the spaces, e.g., about 6 µm to about 20 µm.

In an implementation, the thickness of the insulating adhesive layer may be thicker than the thickness of the conductive adhesive layer.

According to an embodiment, peel strength may be measured by the following process.

For measuring peel strength of the conductive adhesive layer, the multilayer anisotropic conductive film may be left at room temperature (~25° C.) for 1 hour, after which a 1.5 mm-wide piece of the anisotropic conductive film may be pre-bonded on patternless glass at an actually measured temperature of 25° C. and 1 MPa for 1 second, followed by removing a PET release film. Then, an adhesive tape (Nitto Co.) that is 5 cm longer than the anisotropic conductive film (which is pre-bonded on glass and has a width of 1.5 mm) may be prepared. The adhesive tape may be disposed on the anisotropic conductive film (which is pre-bonded on the glass) and attached thereto by rolling a rubber roller two times.

In a like manner, three like specimens may be prepared. Each specimen may be disposed such that an exposed portion of the adhesive tape (e.g., off of the glass) is placed on a UTM, followed by measuring a peel strength value of each specimen and calculating an average peel strength.

The peel strength value of the insulating adhesive layer may be measured in the same way as in the conductive adhesive layer, but an adhesive tape may be attached to the multilayer anisotropic conductive film and a release film may be removed. Then, the anisotropic conductive film may be preliminary pressed on the patternless glass under the same conditions as in measuring the peel strength value of the conductive adhesive layer, then the peel strength value of the insulating adhesive layer may be measured.

The following Examples and Comparative Examples are provided in order to set forth particular details of one or more embodiments. However, it will be understood that the embodiments are not limited to the particular details described. Further, the Comparative Examples are set forth to highlight certain characteristics of certain embodiments, and are not to be construed as either limiting the scope of the invention as exemplified in the Examples or as necessarily being outside the scope of the invention in every respect.

Examples 1, 2 and Comparative Examples 1, 2

Preparation of Multilayer Anisotropic Conductive Film

Example 1

Preparation of an Anisotropic Conductive Film in which the Reactive Monomer of the Conductive Adhesive Layer was Present in a Greater Amount than the Reactive Monomer of the Insulating Adhesive Layer (1) Conductive Adhesive Layer A binder resin (consisting of 5 wt % of an NBR resin (N-34, Nippon Zeon Co.), 24 wt % of a polyurethane binder (NPC7007T, Nanux Inc.), 28 wt % of an acrylic binder (AOF-7003, Aekyung Chemical), and 12 wt % of urethane acrylate (NPC7007, Nanux Inc.)); reactive monomers (consisting of 1 wt % of 2-methacryloyloxyethyl phosphate, 12 wt % of pentaerythritol tri(meth)acrylate, and 12 wt % of 2-hydroxyethyl (meth)acrylate); 3 wt % of lauryl peroxide (as a heat curable initiator); and 3 μm conductive particles (Sekisui Chemical) (as conductive particles) were mixed to manufacture a conductive adhesive layer having a thickness of 4 μm.

(2) Insulating Adhesive Layer

A binder resin (consisting of 5 wt % of an NBR resin (N-34, Nippon Zeon Co.), 29 wt % of a polyurethane binder (NPC7007T, Nanux Inc.), 30 wt % of an acrylic binder (AOF-7003, Aekyung Chemical), and 12 wt % of urethane acrylate (NPC7007, Nanux Inc.)); reactive monomers (consisting of 1 wt % of 2-methacryloyloxyethyl phosphate, 10 wt % of pentaerythritol tri(meth)acrylate, and 10 wt % of 2-hydroxyethyl (meth)acrylate); and 3 wt % of lauryl peroxide (as a heat curable initiator) were mixed to manufacture an insulating adhesive layer having a thickness of 10 μm.

The insulating adhesive layer was stacked on the conductive adhesive layer, thereby preparing a multilayer anisotropic conductive film.

Example 2

Preparation of an Anisotropic Conductive Film in which the Reactive Monomer of the Conductive Adhesive Layer was Present in a Greater Amount than the Reactive Monomer of the Insulating Adhesive Layer (1) Conductive Adhesive Layer A conductive adhesive layer was prepared in the same manner as in (1) of Example 1, except that 20 wt % of a polyurethane binder (NPC7007T, Nanux Inc.), 22 wt % of an acrylic binder (AOF-7003, Aekyung Chemical), 17 wt % of pentaerythritol tri(meth)acrylate, and 17 wt % of 2-hydroxyethyl(meth)acrylate were used.

(2) Insulating Adhesive Layer

An insulating adhesive layer was prepared in the same manner as in (2) of Example 1 except that 27 wt % of a polyurethane binder (NPC7007T, Nanux Inc.), 28 wt % of an acrylic binder (AOF-7003, Aekyung Chemical), 12 wt % of pentaerythritol tri(meth)acrylate and 12 wt % of 2-hydroxyethyl(meth)acrylate were used.

The insulating adhesive layer was stacked on the conductive adhesive layer, thereby preparing a multilayer anisotropic conductive film.

Comparative Example 1

Preparation of an Anisotropic Conductive Film in which the Reactive Monomer of the Insulating Adhesive Layer was Present in a Greater Amount than the Reactive Monomer of the Conductive Adhesive Layer (1) Conductive Adhesive Layer A conductive adhesive layer was prepared in the same manner as in (1) of Example 1, except that 40 wt % of an acrylic binder (AOF-7003, Aekyung Chemical), 6 wt % of pentaerythritol tri(meth)acrylate, and 6 wt % of 2-hydroxyethyl(meth)acrylate were used.

(2) Insulating Adhesive Layer

An insulating adhesive layer was prepared in the same manner as in (2) of Example 1.

The insulating adhesive layer was stacked on the conductive adhesive layer, thereby preparing a multilayer anisotropic conductive film.

Comparative Example 2

Preparation of an Anisotropic Conductive Film in which the Reactive Monomer of the Insulating Adhesive Layer was Present in a Greater Amount than the Reactive Monomer of the Conductive Adhesive Layer (1) Conductive Adhesive Layer A conductive adhesive layer was prepared in the same manner as in (1) of Example 1, except that 31 wt % of a polyurethane binder (NPC7007T, Nanux Inc.), 38 wt % of an acrylic binder (AOF-7003, Aekyung Chemical), 3 wt % of pentaerythritol tri(meth)acrylate, and 4 wt % of 2-hydroxyethyl(meth)acrylate were used.

(2) Insulating Adhesive Layer

An insulating adhesive layer was prepared in the same manner as in (2) of Example 1, except that 17 wt % of a polyurethane binder (NPC7007T, Nanux Inc.), 18 wt % of an acrylic binder (AOF-7003, Aekyung Chemical), 22 wt % of pentaerythritol tri(meth)acrylate, and 22 wt % of 2-hydroxyethyl(meth)acrylate were used.

The insulating adhesive layer was stacked on the conductive adhesive layer, thereby preparing a multilayer anisotropic conductive film.

The amount of the reactive monomers in Examples 1, 2 and Comparative Examples 1, 2 are shown in Table 1, below.

TABLE 1

| | Reactive monomer in conductive adhesive layer (a) | Reactive monomer in insulating adhesive layer (b) | a/b |
|---|---|---|---|
| Example 1 | 25 wt % | 21 wt % | 1.19 |
| Example 2 | 35 wt % | 25 wt % | 1.66 |
| Comparative Example 1 | 13 wt % | 21 wt % | 0.62 |
| Comparative Example 2 | 8 wt % | 45 wt % | 0.18 |

Experimental Example 1

Measurement of Pre-Bonding Processability and Peel Strength

The multilayer anisotropic conductive films according to Examples 1 and 2 and Comparative Examples 1 and 2 were evaluated as to peel strength of each of the conductive adhesive layers and insulating adhesive layers.

To measure the peel strength value of each conductive adhesive layer, each multilayer anisotropic conductive film was left at room temperature (~25° C.) for 1 hour, after which a 1.5 mm-wide piece of the anisotropic conductive film was preliminary pressed on patternless glass at an actually measured temperature of 25° C. and 1 MPa for 1 second, followed by removal of a PET release film. Then, an adhesive tape (Nitto Co.) (which was 5 cm longer than the pre-bonded 1.5 mm wide anisotropic conductive film) was prepared. The adhesive tape was disposed on the anisotropic conductive film (that was pre-bonded on the glass) and attached thereto by rolling a rubber roller twice.

In the same way, three of the same specimens were prepared. Each specimen was disposed such that an exposed portion of the adhesive tape (off of the glass) was placed on a UTM, followed by measuring the peel strength value of each specimen and calculating an average peel strength.

The peel strength value of each insulating adhesive layer was measured in the same way as above, but an adhesive tape was attached to multilayer anisotropic conductive film and release film was removed, and after which the anisotropic conductive film was preliminary pressed on patternless glass under the same conditions as in measuring the peel strength value of the conductive adhesive layer, then the peel strength value of the insulating adhesive layer was measured.

The peel strength values of the conductive adhesive layers and the insulating adhesive layers according to Examples 1 and 2 and Comparative Examples 1 and 2 are shown in Table 2, below.

TABLE 2

|  | Peel strength value of conductive adhesive layer (gf/mm) | Peel strength value of insulating adhesive layer (gf/mm) |
| --- | --- | --- |
| Example 1 | 4.9 | 3.8 |
| Example 2 | 5.8 | 4.7 |
| Comparative Example 1 | 2.5 | 3.8 |
| Comparative Example 2 | 1.3 | 7.8 |

Experimental Example 2

Measurement of Reliability in Adhesive Strength

Each of the multilayer anisotropic conductive films according to Examples 1 and 2 and Comparative Examples 1 and 2 was connected to a metal electrode glass (Mo/Al/Mo structure, Samsung Electronics) and a chip on film (COF, Samsung Electronics) through pre-bonding at an actually measured temperature of 70° C. for 1 second and subjected to final pressing at 180° C. and 4.5 MPa for 5 seconds, thereby preparing 10 specimens of each film. The specimens of each film were evaluated as to initial adhesive strength, and an average value was calculated.

The 10 specimens of each film were subjected to reliability testing at high temperature and humidity, storage at 85° C. and 85% RH for 500 hours, followed by evaluating adhesive strength after reliability testing and calculating an average value.

Experimental Example 3

Measurement of Reliability in Connection Resistance

Each of the multilayer anisotropic conductive films according to Examples 1 and 2 and Comparative Examples 1 and 2 was left at room temperature (~25° C.) for 1 hour and connected to a COF (Samsung Electronics) obtained by forming a 4-probe-measurable pattern on a patternless glass and coated with indium tin oxide (ITO) to a thickness of 1,000 Å, through pre-bonding at an actually measured temperature of 70° C. for 1 second and subjected to final pressing at 180° C. and 4.5 MPa for 5 seconds, thereby preparing 10 specimens of each film. The specimens of each film were evaluated as to initial connection resistance using a 4-probe method (according to ASTM F43-64T) and an average value was calculated.

The 10 specimens of each film were subjected to reliability testing at high temperature and humidity, storage at 85° C. and 85% RH for 500 hours, followed by evaluating connection resistance after reliability (according to ASTM D117) testing and calculating an average value.

Experimental Example 4

Measurement of Generation of a Short Circuit

Each of the multilayer anisotropic conductive films according to Examples 1 and 2 and Comparative Examples 1 and 2 was evaluated as to generation of a short circuit based on a problem rate caused by short circuit after testing 100 times.

Each of the multilayer anisotropic conductive films according to Examples 1 and 2 and Comparative Examples 1 and 2 was left at room temperature (~25° C.) for 1 hour and connected to COF (STEMCO) which is 2-probe-measurable on patternless glass and coated with indium tin oxide (ITO) to a thickness of 1,000 Å, but is unconnected pattern, through pre-bonding at an actually measured temperature of 70° C. for 1 second and subjected to final pressing at 180° C. and 4.5 MPa for 5 seconds, thereby preparing 100 specimens of each film. A voltage of 50 V was applied to the specimens of each film, followed by counting the number of specimens which allowed electric conduction.

Experimental Example 5

Measurement of Elongation

Each of the multilayer anisotropic conductive films according to Examples 1 and 2 and Comparative Examples 1 and 2 was slit into 1.5 mm-wide and 3 cm-long pieces. After removing 2 cm of the release film from the pieces, the release film-removed part of the piece was mounted on the UTM, and the other part (i.e., the portion in which the release film remained) was mounted on an opposite side of the UTM, followed by measuring elongation when the piece was broken, pulling the piece at 50 mm/min using a 5-N load cell.

Results of Experimental Examples 2 to 5 are shown in Table 3, below.

TABLE 3

| | Initial adhesive strength (gf/cm) | Initial connection resistance (Ω) | Adhesive strength after reliability testing for 500 hr (gf/cm) | Connection resistance after reliability testing for 500 hr (Ω) | Short circuit (%) | Elongation (%) |
|---|---|---|---|---|---|---|
| Example 1 | 711 | 0.82 | 628 | 1.68 | 0 | 553 |
| Example 2 | 702 | 0.83 | 621 | 1.65 | 0 | 786 |
| Comparative Example 1 | 724 | 0.81 | 630 | 1.69 | 0 | 380 |
| Comparative Example 2 | 698 | 0.92 | 610 | 1.98 | 4 | 297 |

As may be seen in Tables 2 and 3, the anisotropic conductive films according to Examples 1 and 2 had excellent peel strength values, and exhibited excellent pre-bonding processability and high reliability in terms of adhesive strength and connection resistance without short circuit.

The anisotropic conductive film according to Comparative Example 1 had high reliability in terms of adhesive strength and connection resistance and did not result in a short circuit, but caused process failure due to low pre-bonding processability. The anisotropic conductive film according to Comparative Example 2 exhibited inferior pre-bonding processability due to low peel strength and caused a short circuit.

Accordingly, it may be seen that the amount of the reactive monomers in each of the conductive adhesive layer and the insulating adhesive layer may be an important factor in determining physical properties of the multilayer anisotropic conductive film. Also, it may be seen that an anisotropic conductive film exhibited excellent physical properties when the amount of the reactive monomers in the conductive adhesive layer was higher than the amount of the reactive monomers in the insulating adhesive layer.

By way of summation and review, compact, and small-size IT devices and increased resolution of flat panel displays have been considered. Thus, a width of circuits of the devices have narrowed. Conductive particles in an adhesive layer to connect circuits may agglomerate, thereby causing a short circuit. An anisotropic conductive film having a multilayer structure help prevent such a short circuit.

One type of multilayer anisotropic conductive film may have a structure in which an insulating adhesive layer is stacked on a release film, e.g., a polyethylene terephthalate (PET) film, and a conductive adhesive layer may be stacked thereon. The conductive adhesive layer may contain conductive particles and may have a lower amount of reactive monomers than the insulating adhesive layer, thereby exhibiting high melt viscosity.

When such an anisotropic conductive film is used in bonding, the conductive adhesive layer (having a relatively high melt viscosity) may help suppresses fluidity of the conductive particles to a maximum extent possible, and the insulating adhesive layer (having a relatively low melt viscosity) may fill gaps between electrodes to help prevent a short circuit.

Such an anisotropic conductive film may exhibit insufficient pre-bonding processability. For example, in a module process using an anisotropic conductive film, the anisotropic conductive film may be subjected to pre-bonding process in which the anisotropic conductive film is arranged on glass and fixed through thermal pressing, followed by removing the release film. Here, the anisotropic conductive film may include the conductive adhesive layer (bonded to the glass) may have a higher melt viscosity than the insulating adhesive layer (adjacent to the release film). Thus, the conductive adhesive layer may exhibit low adhesion to the glass. Accordingly, when removing the release film, the anisotropic conductive film may be separated from the glass during the pre-bonding process, causing process failure. If such process failure occurs in final pressing, the glass may be subjected to a reworking process to remove a tap and a manual pre-bonding process of the anisotropic conductive film, instead of being discarded.

For example, one type of multilayer anisotropic conductive film may include two kinds of organic peroxides having different one-minute half-lives as a polymerization initiator to achieve quick curing at low temperature.

Another type of multilayer anisotropic conductive film may include nano-silica added to an insulating adhesive layer to thereby enhance adhesive strength of the insulating adhesive layer.

Yet another type of multilayer anisotropic conductive film may include a conductive adhesive layer having higher melt viscosity than an insulating adhesive layer and including a plurality of holes, and may be applied to fine pitches.

A defect may occur in pre-bonding if a conductive adhesive layer has lower melt viscosity than an insulating adhesive layer because the adhesion of the conductive adhesive layer is low. Accordingly, the embodiments provide an anisotropic conductive film and a semiconductor device bonded by the film having excellent adhesion by making the amount of reactive monomers in the conductive adhesive layer higher than the amount of reactive monomers in the insulating adhesive layer.

For example, the embodiments provide an anisotropic conductive film and a semiconductor device bonded by the film having enhanced adhesion of the conductive adhesive layer to achieve excellent pre-bonding processability while still preventing of short circuit.

The anisotropic conductive film according to an embodiment may exhibit enhanced adhesion of a conductive adhesive layer, thereby providing excellent pre-bonding processability.

For example, according to an embodiment, the amount of reactive monomers in the conductive adhesive layer may be higher than the amount of reactive monomers in the insulating adhesive layer to thereby enhance adhesion of the conductive adhesive layer in pre-bonding, thus facilitating removal of a release film. In addition, in final pressing, due to quick or high reactivity of the conductive adhesive layer, the fluidity of the conductive adhesive layer may be drastically reduced, as compared with that of the insulating adhesive layer, thereby reducing the likelihood of and/or preventing a short circuit.

The embodiments provide an anisotropic conductive film in which the melt viscosity of the conductive adhesive layer is higher than that of the insulating adhesive layer (to prevent conductive particles from flowing) and also exhibits improved adhesion of the conductive adhesive layer, i.e., resolving defects in pre-bonding.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A semiconductor device bonded by an anisotropic conductive film, the anisotropic conductive film including a conductive adhesive layer and an insulating adhesive layer stacked thereon, an amount of reactive monomers in the conductive adhesive layer being higher than an amount of reactive monomers in the insulating adhesive layer.

2. The semiconductor device as claimed in claim 1, wherein:
the amount of the reactive monomers in the conductive adhesive layer is about 25 to about 50 wt %, based on a total weight of the conductive adhesive layer, and
the amount of the reactive monomers in the insulating adhesive layer is about 20 to about 40 wt %, based on a total weight of the insulating adhesive layer.

3. The semiconductor device as claimed in claim 1, wherein the amount of the reactive monomers in the conductive adhesive layer is greater than one to about two times the amount of the reactive monomers in the insulating adhesive layer.

4. The semiconductor device as claimed in claim 1, wherein the reactive monomers of at least one of the conductive adhesive layer and the insulating adhesive layer include at least one selected from the group of 2-methacryloyloxyethyl phosphate, pentaerythritol tri(meth)acrylate, and 2-hydroxyethyl(meth)acrylate.

5. The semiconductor device as claimed in claim 1, the anisotropic conductive film including about 20 to about 45 wt % of a reactive monomer and about 55 to about 80 wt % of a binder resin, based on a total weight of the anisotropic conductive film, the conductive adhesive layer and the insulating adhesive layer having different peel strength values.

6. The semiconductor device as claimed in claim 5, wherein the reactive monomer includes at least one selected from the group of 2-methacryloyloxyethyl phosphate, pentaerythritol tri(meth)acrylate, and 2-hydroxyethyl(meth)acrylate.

7. The semiconductor device as claimed in claim 5, wherein the peel strength value of the conductive adhesive layer is greater than the peel strength value of the insulating adhesive layer.

8. The semiconductor device as claimed in claim 7, wherein:
the peel strength value of the conductive adhesive layer is about 3 to about 10 gf/mm at 25° C. and 1 MPa for 1 second, and
the peel strength value of the insulating adhesive layer is about 2 to about 7 gf/mm at 25° C. and 1 MPa for 1 second.

9. The semiconductor device as claimed in claim 1, the anisotropic conductive film including about 45 to about 75 wt % of a thermoplastic resin, about 1 to about 10 wt % of conductive particles, and about 20 to about 45 wt % of a reactive monomer, based on a total weight of the anisotropic conductive film, the anisotropic conductive film having an elongation of 400 to 800%.

10. The semiconductor device as claimed in claim 9, wherein the reactive monomer includes at least one selected from the group of 2-methacryloyloxyethyl phosphate, pentaerythritol tri(meth)acrylate, and 2-hydroxyethyl(meth)acrylate.

* * * * *